United States Patent
Tamarkin et al.

(10) Patent No.: US 6,428,327 B1
(45) Date of Patent: Aug. 6, 2002

(54) FLEXIBLE ADAPTER FOR USE BETWEEN LGA DEVICE AND PRINTED CIRCUIT BOARD

(75) Inventors: Vladimir K. Tamarkin, Huntingdon Valley, PA (US); Frank J. Campisi, Mullica Hill, NJ (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/418,665

(22) Filed: Oct. 14, 1999

(51) Int. Cl.[7] .................................................. H01R 12/00
(52) U.S. Cl. ........................................ 439/67; 439/957
(58) Field of Search ............................ 439/66, 67, 225, 439/912, 957; 324/754

(56) References Cited

U.S. PATENT DOCUMENTS

| | | | |
|---|---|---|---|
| 4,360,858 A | * 11/1982 | Fahling | |
| 4,438,561 A | 3/1984 | Mueller | |
| 4,554,505 A | 11/1985 | Zachry | |
| 4,803,595 A | 2/1989 | Kraus et al. | |
| 4,872,843 A | 10/1989 | Anstey | |
| 4,912,401 A | 3/1990 | Nady, II et al. | |
| 5,092,788 A | 3/1992 | Pristupa, Jr. et al. | |
| 5,109,320 A | * 4/1992 | Bourdelaise et al. | |
| 5,109,596 A | * 5/1992 | Driller et al. | |
| 5,147,209 A | 9/1992 | Litwin et al. | |
| 5,176,524 A | 1/1993 | Mizuno et al. | |
| 5,177,594 A | 1/1993 | Chance et al. | |
| 5,205,741 A | 4/1993 | Steen et al. | |
| 5,237,131 A | 8/1993 | Catlin | |
| 5,276,817 A | 1/1994 | Matschke et al. | |
| 5,358,412 A | * 10/1994 | Maurinus et al. | 439/66 |
| 5,383,787 A | 1/1995 | Switky et al. | |
| 5,384,955 A | 1/1995 | Booth et al. | |
| 5,394,009 A | * 2/1995 | Loo | 257/666 |
| 5,460,531 A | 10/1995 | Vivio | |
| 5,468,157 A | 11/1995 | Roebuck et al. | |
| 5,475,317 A | * 12/1995 | Smith | 324/760 |
| 5,683,256 A | 11/1997 | Werther | |
| 5,727,955 A | 3/1998 | Tsubakihara | |
| 5,743,748 A | 4/1998 | Takahata et al. | |
| 5,806,181 A | 9/1998 | Khandros et al. | |
| 5,809,641 A | 9/1998 | Crudo et al. | |
| 5,834,335 A | 11/1998 | Buschbom | |
| 5,883,788 A | 3/1999 | Ondricek et al. | |
| 5,890,284 A | 4/1999 | Chartrand et al. | |
| 5,903,162 A | * 5/1999 | Cole et al. | 324/754 |
| 6,027,346 A | * 2/2000 | Sinsheimer | 439/66 |
| 6,249,131 B1 | * 6/2001 | Nangle | 324/754 |

* cited by examiner

Primary Examiner—Neil Abrams
(74) Attorney, Agent, or Firm—Lise A. Rode; Michael B. Atlass; Mark T. Starr (57) ABSTRACT

An adapter is provided for use with a land grid array (LGA) device that is mounted on a circuit board, wherein an interposer socket having compliant contacts provides electrical coupling between pads provided on the LGA device and pads provided on the circuit board. The adapter includes a flexible substrate and a plurality of conductors extending through the flexible substrate. The flexible substrate is configured to flex in reaction to the force exerted by the compliant contacts of the interposer socket. A circuit board assembly and method are also provided. The adapter may include a periphery pad (416) for solder connection to an external circuit wire (336) and is usable for modification of the circuitry on the circuit board.

10 Claims, 8 Drawing Sheets

FLEXIBLE ADAPTER FOR USE BETWEEN LGA DEVICE AND PRINTED CIRCUIT BOARD

FIELD OF THE INVENTION

This invention relates to an adapter and method for modifying printed circuit boards. More particularly, this invention relates to an adapter and method suited for modifying printed circuit board assemblies having a land grid array (LGA) device and an interposer socket having compliant contacts for providing electrical coupling between pads of the LGA device and pads of a circuit board to which the LGA device is to be mounted.

BACKGROUND OF THE INVENTION

Manufacturers that are involved in the design and fabrication of printed circuit boards may, under some circumstances, find it necessary to modify newly designed printed circuit boards in order to implement engineering improvements. Over the years, various rework techniques have been proposed for use with printed circuit boards.

These proposed techniques are often specialized in that they are suited for use with particular types of printed circuit boards and circuit board components. Accordingly, some of the techniques proposed in the past are appropriate for use with certain component types but may be ineffective for use with other types of components.

Figure 1:
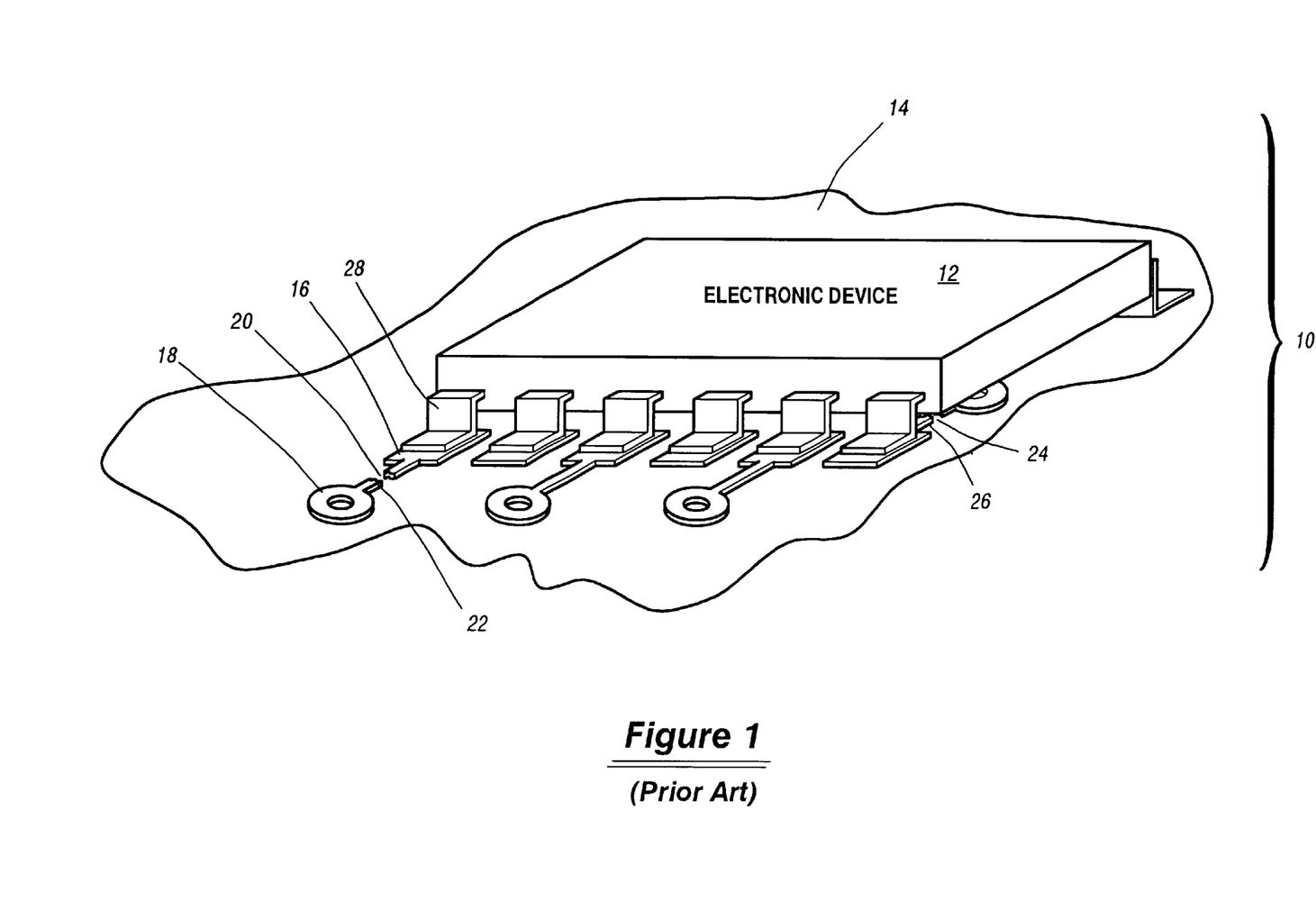
FIG. 1 is a perspective view of a circuit board assembly for illustrating pin isolation.

For example, referring generally to FIGS. 1 and 2, an exemplary printed circuit board modification procedure will now be described. Referring first to FIG. 1, a circuit board assembly 10 includes an electronic device 12 mounted to a circuit board 14. Circuit board 14 includes a plurality of pads 16, and surface traces connect the pads 16 to a plurality of vias 18. Electronic device 12 is provided with a plurality of pins or leads 28, which provide for electrical coupling with selected pads 16 on the circuit board 14.

A modification can be made to such a printed circuit board in two stages. The first stage can be considered "pin isolation," wherein a pin of an electronic device is isolated from a circuit on the printed circuit board. This stage is illustrated in FIG. 1, wherein a surface trace cut isolates a surface mount pad from a via hole that is connected to the rest of the circuit More specifically, a surface trace cut 20 is made in order to isolate a surface mount pad 16 from a via 18. The surface trace cut 20 therefore provides an accessible connection 22 to which a modification can be made (as shown in FIG. 2). A surface trace cut 24, however, is hidden beneath electronic device 12. Accordingly, surface trace cut 24 provides an inaccessible connection 26.

Figure 2:
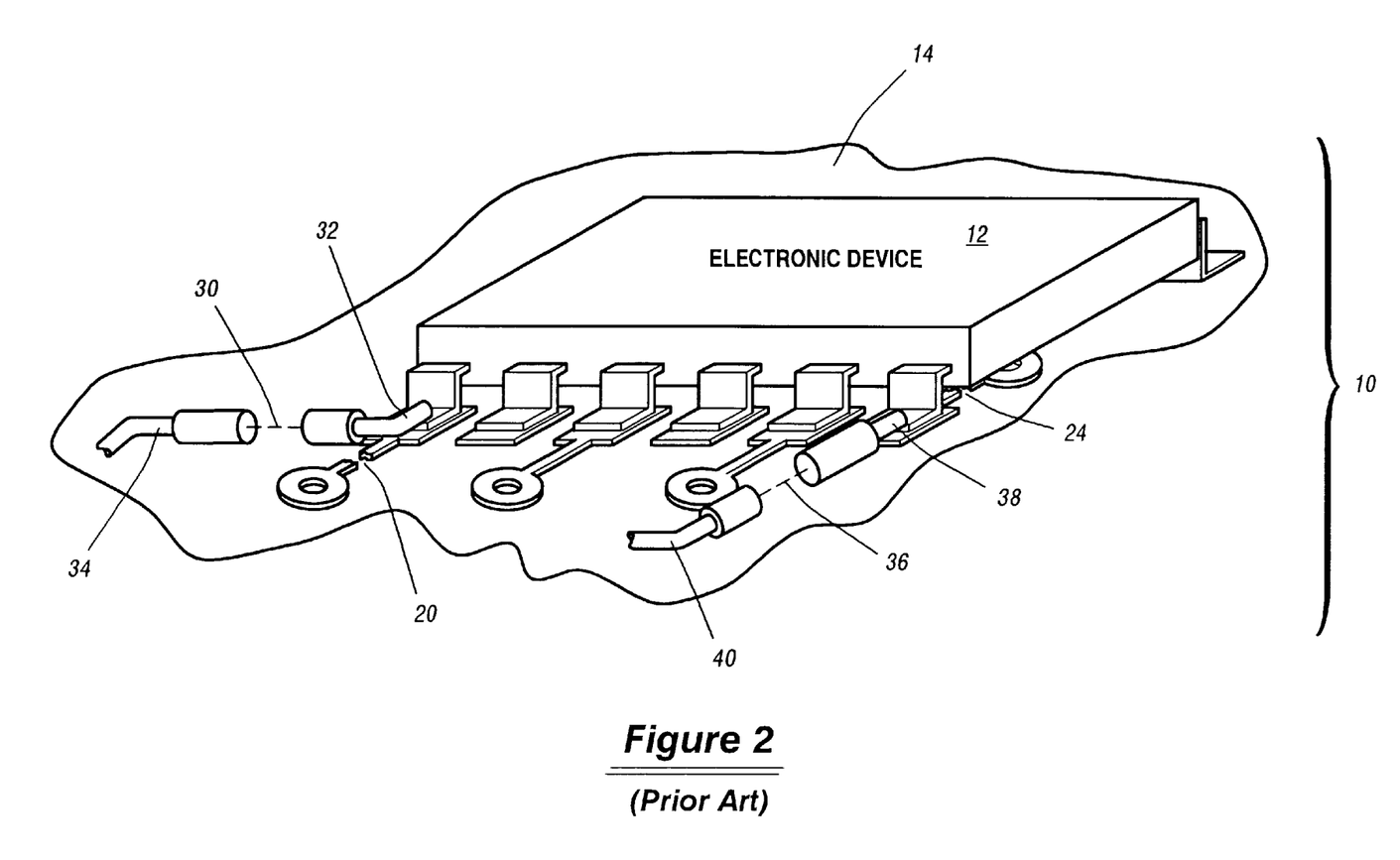
FIG. 2 is a perspective view of the circuit board assembly illustrated in FIG. 1, for illustrating circuit re-connection.

Referring now to FIG. 2, the second stage is illustrated. In this stage, which can be considered a "circuit re-connection" stage, a pin of an electronic device is connected to another circuit using a wire. Specifically, a wire 30 is connected to a pin or lead 28 of electronic device 12 by means of a soldered connection 32. An opposite end 34 of wire 30 is provided for connection to an external circuit. Similarly, a second wire 36 is connected to another pin or lead of electronic device 12 at a soldered connection 38. An opposite end of wire 36 is provided with an end 40 for connection to an external circuit.

Pin isolation for an electronic device such as device 12 is usually a straight forward procedure and the manner m which circuit re-connection is made depends primarily on the accessibility of the surface trace being cut or on the accessibility of the pin that is to be isolated. For example, if a trace is not readily accessible (e.g., for making the surface trace cut 24 illustrated in FIG. 1), then an electronic device such as device 12 is first removed from the printed circuit board so that the trace can be accessed, and the device can be subsequently reinstalled. Nevertheless, an inaccessible connection such as connection 26 can be overcome by connecting a wire directly to the exposed lead of the device such as at soldered connection 38.

It will be appreciated, therefore, that the modification procedure illustrated in FIGS. 1 and 2 is suitable for use with devices such as device 12 that have pin-type leads, but that the modification will not be adequate for use with electronic devices of the type where the pins or leads of the device are not accessible. Accordingly, there remains a need for an adapter and method for use with electronic devices which have leads that are not easily accessible. More specifically, there remains a need for an adapter and method that can be used with land grid array (LGA) devices.

SUMMARY OF THE INVENTION

This invention provides an adapter for use with a land grid array (LGA) device and an interposer socket having compliant contacts for providing electrical coupling between pads on the LGA device and pads on a circuit board to which the LGA device is to be mounted. The adapter includes a flexible substrate configured to positioned adjacent the interposer socket. The adapter also includes a plurality of conductors extending through the flexible substrate, and the conductors include pads adjacent facing surfaces of the flexible substrate. The flexible substrate is configured to flex in reaction to forces exerted by the compliant contacts of the interposer socket. The flexibility of the substrate facilitates contact between the pads of the conductors adjacent one surface of the flexible substrate with the compliant contacts of the interposer socket. The flexibility of the substrate also facilitates contact between the pads of the conductors adjacent an opposite surface of the flexible substrate with pads of the circuit board (when the adapter is positioned between the interposer socket and the circuit board) or with pads of the LGA device (when the adapter is positioned between the interposer socket and the LGA device).

According to another aspect of this invention, a circuit board assembly is provided. The assembly includes a circuit board having a plurality of pads and a land grid array (LGA) device also having a plurality of pads. The assembly also includes an interposer socket positioned to extend in a space between the circuit board and the LGA device and having a plurality of compliant contacts positioned for contact with the pads of the LGA device or the pads of the circuit board. The assembly further includes an adapter positioned to extend in a space between the interposer socket and the circuit board or, alternatively, in a space between the interposer socket and the LGA device. The adapter comprises a flexible substrate positioned adjacent the interposer socket and a plurality of conductors extending through the flexible substrate. The conductors include pads adjacent facing surfaces of the flexible substrate. Pads adjacent one facing surface of the flexible substrate are positioned for electrical contact with the compliant contacts of the interposer socket. The flexible substrate of the adapter is configured to flex in reaction to forces exerted by the compliant contacts of the interposer socket. Accordingly, electrical contact is maintained between the pads of the circuit board and the pads of the adapter when the adapter is positioned between the interposer socket and the circuit board. Alternatively, electrical contact is maintained between the pads of the LGA device and the pads of the adapter when the adapter is positioned between the interposer socket and the LGA device.

According to yet another aspect of this invention, a method is provided for adapting a circuit board assembly having a land grid array (LGA) device and an interposer socket extending between the LGA device and a circuit board. An adapter having a flexible substrate and conductors extending therethrough is provided. The adapter is positioned between the interposer socket and the circuit board or, alternatively, between the interposer socket and the LGA device. Selected electrical coupling is provided through the adapter between the compliant contacts of the interposer socket and pads on the circuit board (when the adapter is positioned between the interposer socket and the circuit board) or through the adapter between the compliant contacts of the interposer socket and pads on the LGA device (when the adapter is positioned between the interposer socket and the LGA device). Pressure is applied to urge the LGA device and the circuit board toward one another, and the compliant contacts of the interposer socket are electrically coupled to the conductors of the adapter. Also, the conductors of the adapter are electrically coupled to the pads of the circuit board when the adapter is positioned between the interposer socket and the circuit board. Alternatively, the conductors of the adapter are electrically coupled to the pads of the LGA device when the adapter is positioned between the interposer socket and the LGA device.

BRIEF DESCRIPTION OF THE DRAWINGS

Exemplary embodiments of this invention will now be described with reference to the drawings, of which.

DETAILED DESCRIPTION OF THE INVENTION

This invention will now be described with reference to specific embodiments selected for illustration in the drawings. It will be appreciated that the spirit and scope of this invention is not limited to the embodiments selected for illustration. Instead, the scope of this invention is defined separately in the appended claims. Also, it will be appreciated that the drawings are not rendered to any particular proportion or scale.

According to a preferred aspect of this invention, an adapter and method are provided for modifying printed circuit boards having land grid array (LGA) devices. More specifically, this invention relates to the modification or repair of circuit boards on which LGA devices are mounted and an interposer socket having compliant contacts is used to bring about electrical coupling between LGA pads and circuit board pads. In order to maintain electrical coupling in such an assembly, pressure is applied by mechanical fasteners between the LGA device and a back-up plate positioned on the side of the circuit board opposite that of the LGA device. Although the invention is described with reference to LGA devices, it is contemplated that the adapter and method of this invention can be used in connection with other electronic components as well.

An exemplary adapter according to the invention is a flex circuit having an array of plated vias with a pad on each side. In order to form a modified electrical connection in a circuit board assembly, the adapter can be provided with a copper trace that is routed to a periphery pad to which an electrical connection can be made (e.g., by means of a wire soldered to the periphery pad). The flex circuit or substrate of the adapter is sufficiently flexible so that the force of the compliant contacts (or springs) of an interposer socket is transferred through the adapter to the circuit board when the adapter is positioned between the interposer socket and the circuit board. The flex circuit or substrate of the adapter is also sufficiently flexible so that the force of the compliant contacts is transferred through the adapter to an LGA device when the adapter is positioned between the interposer socket and an LGA device.

In other words, the flex circuit of the adapter should have flexibility sufficient to conform the lands or pads of the adapter to the lands or pads of the circuit board or LGA device under the influence of the compliant contacts of the interposer socket. Most preferably, the flex circuit of the adapter is made of polymeric film as opposed to the glass fiber-reinforced materials used to form printed circuit boards.

According to another preferred aspect of the invention, an LGA assembly is provided including (1) a circuit board having one or more circuit board pads, (2) an LGA device having one or more LGA pads, (3) an adapter formed from a flex circuit with plated vias with one or more pads on each side, (4) an interposer socket including compliant contacts positioned for contact between the LGA pads and the adapter pads when the adapter is positioned between the interposer socket and the LGA device, and (5) a back-up plate to facilitate pressure applied between the LGA device and the circuit board in order to transfer the force applied by the compliant contacts of the interposer socket through the vias on the adapter to maintain electrical coupling. A corresponding method is also provided.

This invention overcomes the disadvantages associated with conventional circuit board rework methods. For example, when LGA devices are mounted on a circuit board, a via can be partially drilled out from the opposite side of the circuit board in order to break internal circuit connections. An insulated wire can then be attached to a surface trace, on the facing surface of the circuit board, that is still connected to a surface mount pad. However, the solder and the tip of the wire extending through the circuit board often interfere with the interposer socket, and the wire (which would extend outwardly from the opposite surface of the circuit board) can also interfere with the pressure back plate of the assembly. Furthermore, the relationship between the interposer socket contacts and the lands or pads is changed and a great deal of labor is required. Accordingly, the adapter and method of this invention reduces labor costs and improves product quality.

Figure 3:
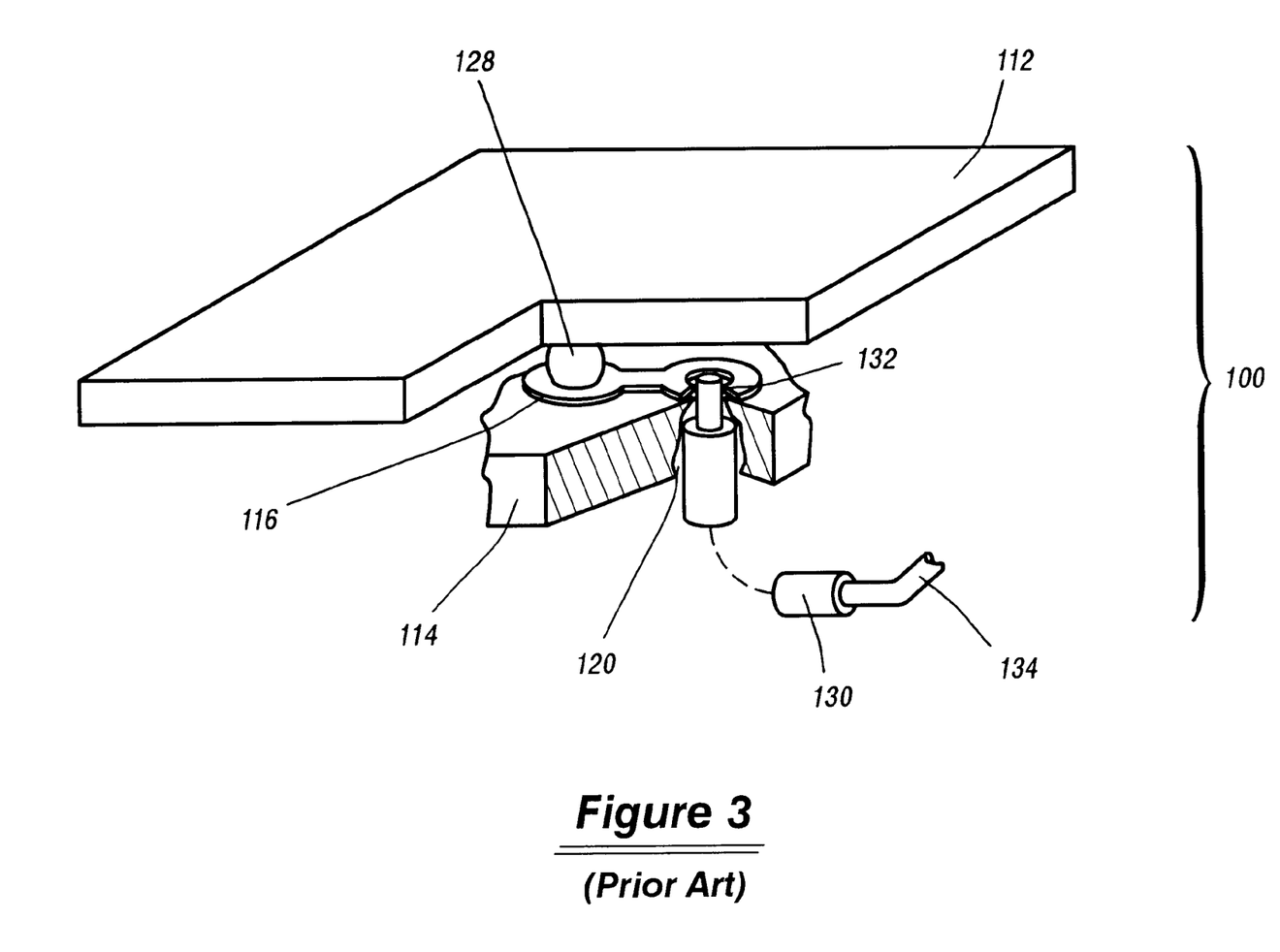
FIG. 3 is a perspective view of a circuit board assembly including a ball grid array (BGA) device.

For example, referring to FIG. 3, a modification procedure suitable for use with a ball grid array (BGA) device is illustrated. More specifically, a printed circuit board assembly 100 is provided with a BGA device 112 mounted to a circuit board 114. BGA device 112 includes a plurality of balls 128 (only one shown) that are soldered to surface pads such as surface pad 116 on circuit board 114. As is illustrated in FIG. 3, the circuit board 114 is drilled out at 120 (after BGA device is removed) from a bottom surface in order to sever internal connections to a via. An insulated wire such as wire 130 is then soldered to a via pad 132 for electrical connection to a surface trace that is in turn connected to surface pad 116. The BGA device is then reinstalled on circuit board 114. The wire 130 is provided with an end 134 for connection to an external circuit.

It has been discovered that this modification procedure can be tedious and require significant operator skill. It has also been discovered that the procedure illustrated in FIG. 3 is not always appropriate for modification of a printed circuit board assembly including an LGA device—LGA devices present a unique set of challenges. For example, LGA devices (such as the one illustrated in FIG. 4) are not soldered to a board in the manner in which BGA devices are mounted. Instead, a land grid connector in the form of an interposer socket is used to make electrical connections between the pads or lands on the LGA device and corresponding pads on the printed circuit board. Compliant contacts such as springs are provided on the interposer socket for electric coupling between the LGA device and the circuit board. Pressure is applied between the LGA device and the printed circuit board (by means of a back-up plate and mechanical fasteners) in order to compress the interposer socket between the device and the board so as to establish an electrical path between the corresponding pads.

Figure 4:
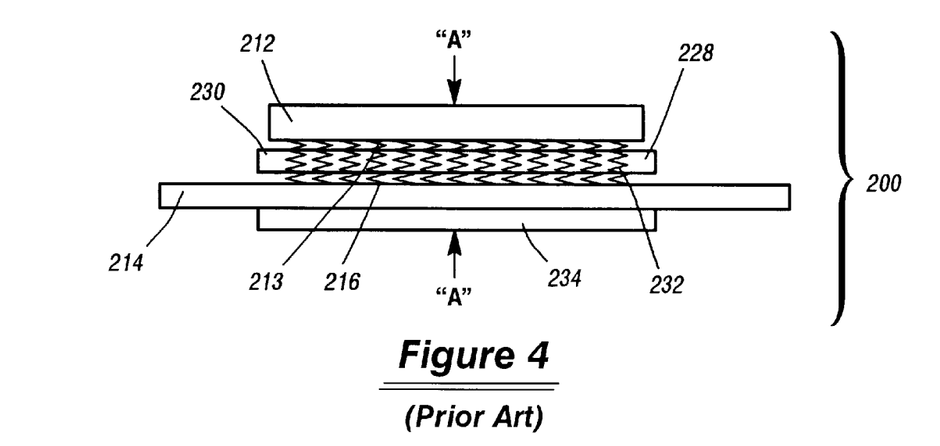
FIG. 4 is a side view of an embodiment of a circuit board assembly including a land grid array (LGA) device and an interposer socket.

Referring now to FIG. 4, for example, a circuit board assembly 200 includes an LGA device 212 that is mounted to a circuit board 214. The LGA device 212 includes LGA pads 213, and the circuit board 214 includes circuit board pads 216. An interposer socket 228 is interposed between LGA device 212 and circuit board 214. Interposer socket 228 includes a socket body 230 and a plurality of compliant contacts in the form of conductive springs 232. The compliant contacts 232 provide for electrical coupling between the LGA pads 213 on the LGA device 212 and the circuit board pads 216 on the circuit board 214.

A back-up plate 234 is also provided for mechanical connection, and pressure indicated by the letters "A" in FIG. 4 is applied to urge the LGA device 212 and the circuit board 214 toward one another. Mechanical fasteners such as bolts, screws and other known fasteners (not shown) are used to couple the LGA device 212 to the backup plate 234 in order to generate such pressure. Accordingly, electrical coupling is maintained between the LGA device 212 and the circuit board 214 by means of compliant contacts 232.

A pin isolation technique used for LGA devices can be the same as that used for BGA devices as shown in FIG. 3. However, if re-connection of leads of the LGA device is required, a wire such as wire 130 attached as shown in FIG. 3 may interfere with an interposer socket. Such interference may be the result of the solder connection between the end of the wire and the via pad, which will be adjacent to the surface of the circuit board with which the compliant contacts of the interposer socket come in contact. Also, wires attached as shown in FIG. 3 may interfere with back-up hardware such as back-up plate 234 shown in FIG. 4. Accordingly, the connection of a wire as shown in FIG. 3 can, in some circumstances, result in an unreliable electrical connection between the LGA device and the circuit board.

It has also been discovered that the use of a previously unused pad that is not connected to a via may not be advantageous with the modification of a printed circuit board having an LGA device. Specifically, an engineering change to add a wire to such a pad can make a printed circuit board un-repairable because the pad may not be accessible.

Figure 5A:
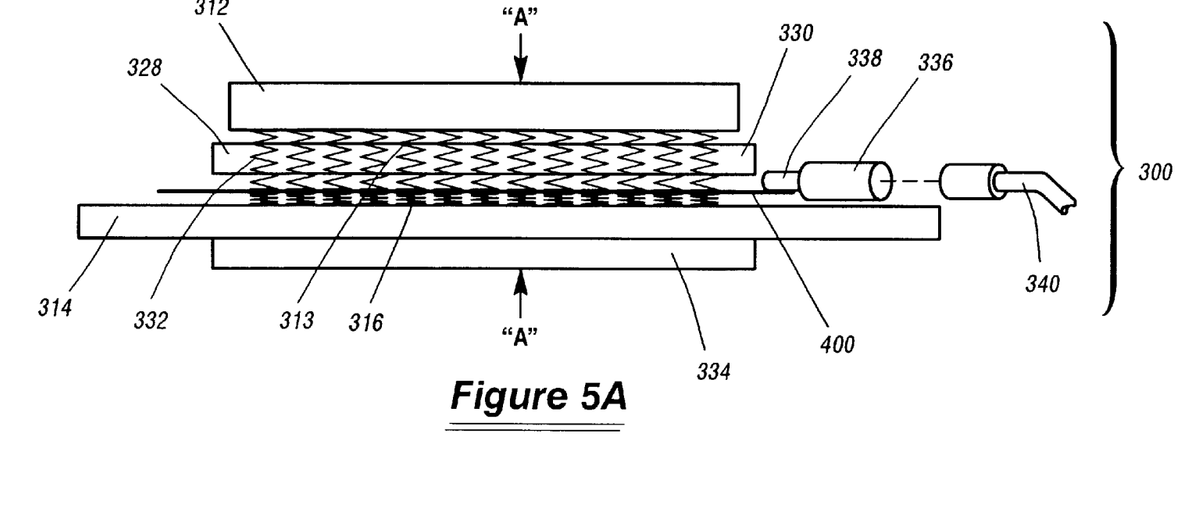
FIG. 5A is a side view of an exemplary embodiment of a circuit board assembly including an adapter according to aspects of this invention.
Figure 6:
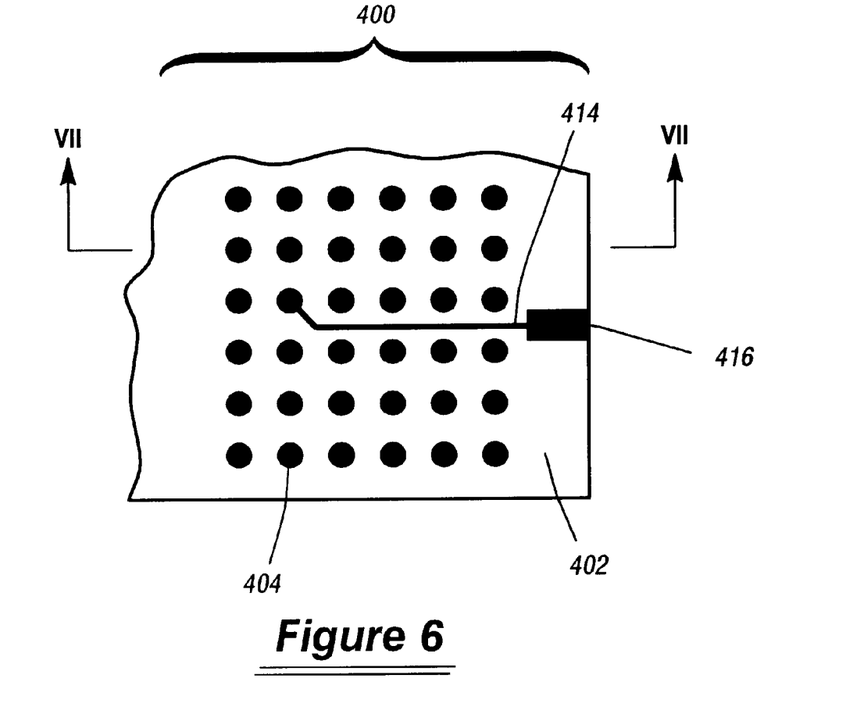
FIG. 6 is a top view of a portion of the adapter illustrated in FIG. 5.
Figure 7:
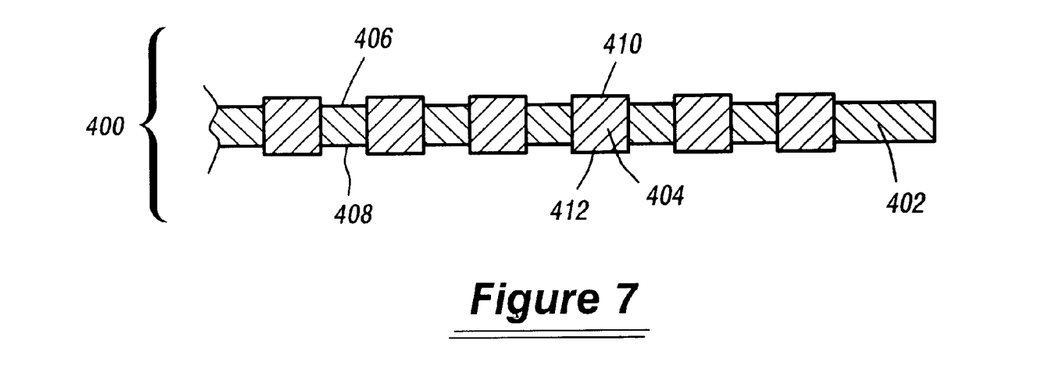
FIG. 7 is a cross-sectional side view of the portion of the adapter illustrated in FIG. 6.

An exemplary embodiment of an adapter and method according to this invention is illustrated in FIGS. 5–7. Referring generally to FIGS. 5–7, an adapter 400 is provided for use with a land grid array (LGA) device 312 that is mounted to a circuit board 314. An interposer socket 328 having a socket body 330 and compliant contacts 332 extending therethrough provides electrical coupling between pads 313 provided on the LGA device 312 and pads 316 provided on the circuit board 314.

Interposer sockets such as socket 328 can be solderless compression connectors such as those that are adapted for use in high-density applications. To provide compliant contacts, they can utilize molybdenum wire formed into a cylindrical omni-directional spring, for example. The compliant contacts can be in the form of a spring alone or a spring in combination with one or more plungers or spacers. The compliant contacts can be positioned in a socket body in the form of a thermoplastic carrier. A wide variety of interposers is contemplated. For examples of interposer sockets, reference can be made to the products provided under the trademark CIN::APSE by Cinch Connectors of Lombard, Ill., which is a division of Labinal Components and Systems, Inc.

The adapter 400 includes a flexible substrate 402 configured to be positioned adjacent the interposer socket 328. The adapter also includes a plurality of conductors such as vias 404 extending through the flexible substrate 402. The conductors each include pads 410 and 412 at facing surfaces thereof. The flexible substrate is configured to flex in reaction to forces exerted by the compliant contacts 332 of the interposer socket 328. Contact between the pads 410 adjacent one surface 406 of the flexible substrate 402 with the compliant contacts 332 is thereby facilitated. Also, contact between pads 412 adjacent an opposite surface 408 of the flexible substrate 402 with the pads 316 of the circuit board 314 is facilitated.

Although the adapter 400 illustrated in FIGS. 6 and 7 is shown to be interposed between the interposer socket 328 and the circuit board 314 in FIG. 5, it will be appreciated that the adapter according to this invention is alternatively positioned between the interposer socket 328 and the LGA device 312. In other words, the adapter can be positioned adjacent either side of the interposer socket.

A circuit board assembly 300 is also provided according to this invention. Circuit board assembly 300 includes a circuit board 314 having a plurality of pads 316 provided thereon, a land grid array (LGA) device 312 extending parallel to the circuit board 314 and having a plurality of pads 313 provided thereon, and an interposer socket 328 extending parallel to the LGA device 312 and having a plurality of compliant contacts 332 positioned for contact with the pads 313 provided on the LGA device 312. An adapter 400 extends between the interposer socket 328 and the circuit board 314. Again, adapter 400 can also be positioned to extend in the space between the interposer socket 328 and the LGA device 312.

Referring now to FIGS. 6 and 7, change adapter 400 includes a flex circuit 402 through which a plurality of plated vias such as conductors 404 extend. In other words, plated vias 404 extend through flex circuit 402 from one surface 406 of flex circuit 402 to an opposite surface 408 of flex circuit 402. Each of the plated vias 404 is provided with a pad 410 adjacent to surface 406 and a pad 412 adjacent to surface 408. It will be understood that, in order to facilitate electrical coupling with vias 404, pad 410 extends upwardly beyond surface 406 of flex circuit 402, and pad 412 extends downwardly below surface 408 of flex circuit 402.

As is illustrated in FIG. 6, a conductor such as copper trace 414 is provided to extend from one of the plated vias 404 for electrical connection to an external circuit by means of a wire such as wire 336 (FIG. 5). It is in this manner that a circuit board assembly can be modified in order to carry out an engineering improvement. Specifically, the connection of a via to an external circuit changes the circuitry of the assembly to achieve a desired modification. In order to facilitate such connection to an external circuit, a periphery pad 416 is connected at the terminal end of copper trace 414 so as to provide a surface to which a wire can be soldered, such as at 338 (FIG. 5). In order to make an electrical connection between adapter 400 and an external circuit, a wire 336 is soldered at 338 to the periphery pad 416 shown in FIG. 6. An opposite end 340 of wire 336 is provided for connection to the external circuit.

It will be understood that the pin isolation techniques for LGA devices such as LGA device 312 can be the same as those used for BGA devices as described previously with reference to FIG. 3. In other words, an LGA device such as device 312 and a respective interposer socket such as socket 328 can be removed from the circuit board 314 and a pad (not shown) can be isolated from a via 404 with a surface cut. In order to re-connect a pad to a circuit, the circuit change adapter 400 is mounted between the board 314 and the socket 328 as shown in FIGS. 5 and 6. Alternatively, the adapter can be positioned between the interposer socket 328 and the LGA device 312.

The adapter 400, which is preferably in the form of a flex-circuit with a set of plated vias arranged in a pattern corresponding to the LGA device 312, establishes electrical connection as the compliant contacts 332 of interposer socket 328 push on the vias against the pads 316 on the board 314. Alternatively, if the adapter 400 is positioned between the interposer socket 328 and the LGA device 312, the adapter 400 establishes electrical connection between the LGA device and the interposer socket.

The circuit change adapter 400 is preferably designed to match a socket "footprint" including alignment and mounting features. Periphery pads such as pad 416 are positioned such that they are accessible after an adapter and a socket are mounted on a printed circuit board. Accordingly, it will be appreciated that an adapter according to this invention is a simple and inexpensive flex circuit that can be quickly designed and fabricated in order to implement a specific engineering rework, modification, or design improvement.

It has been recognized that the substrate of a circuit board can have surfaces that are not planar. For example, the thickness of the substrate may vary along the length of a substrate or the substrate, even if of constant thickness, may be warped or otherwise deformed prior to assembly of a circuit board or as a result of the assembly process (e.g., due to heat generation or clamps). In some circumstances, such variations in thickness and board deformation can coexist. Additionally, tolerances of the plating of the circuit board's substrate may result in thickness variations.

It has been discovered that the flexibility of the substrate used to form an adapter according to this invention compensates for variations in the surface uniformity of a circuit board. In other words, the flexible carrier or substrate of flex circuit 402, in combination with the individually compliant contacts 332 of socket 328, accommodates variations in surface planarity as well as plating tolerances of both an adapter and the printed circuit board.

A method according to this invention is therefore provided for adapting a circuit board assembly 400 having a land grid array (LGA) device 312 and an interposer socket 328 extending between the LGA device and a circuit board. An adapter 400 having a flexible substrate 402 and conductors 404 extending therethrough is provided. The adapter 400 is positioned between the interposer socket 328 and the circuit board 314 or between the interposer socket 328 and the LGA device 312. When the adapter is positioned between the interposer socket and circuit board, selected electrical coupling is provided through the adapter between the compliant contacts 332 of the interposer socket 328 and pads 316 formed on the circuit board 314. Alternatively, if the adapter is positioned between the interposer socket and the LGA device, selected electrical coupling is provided through the adapter between the compliant contacts 332 of the interposer socket 328 and pads 313 formed on the LGA device 312. Pressure is applied to urge the LGA device 312 and the circuit board 314 toward one another. Electrical coupling between the compliant contacts of the interposer socket 328 and the conductors 404 of the adapter 400 is thereby facilitated. Also, electrical coupling between the conductors 404 of the adapter 400 and the pads 316 of the circuit board 314 is thereby facilitated as well as illustrated in FIG. 5. Alternatively, when the adapter is positioned between the interposer socket and the LGA device, electrical coupling between the conductors 404 of the adapter 400 and the pads 313 of the LGA device 312 is facilitated.

Figure 8:
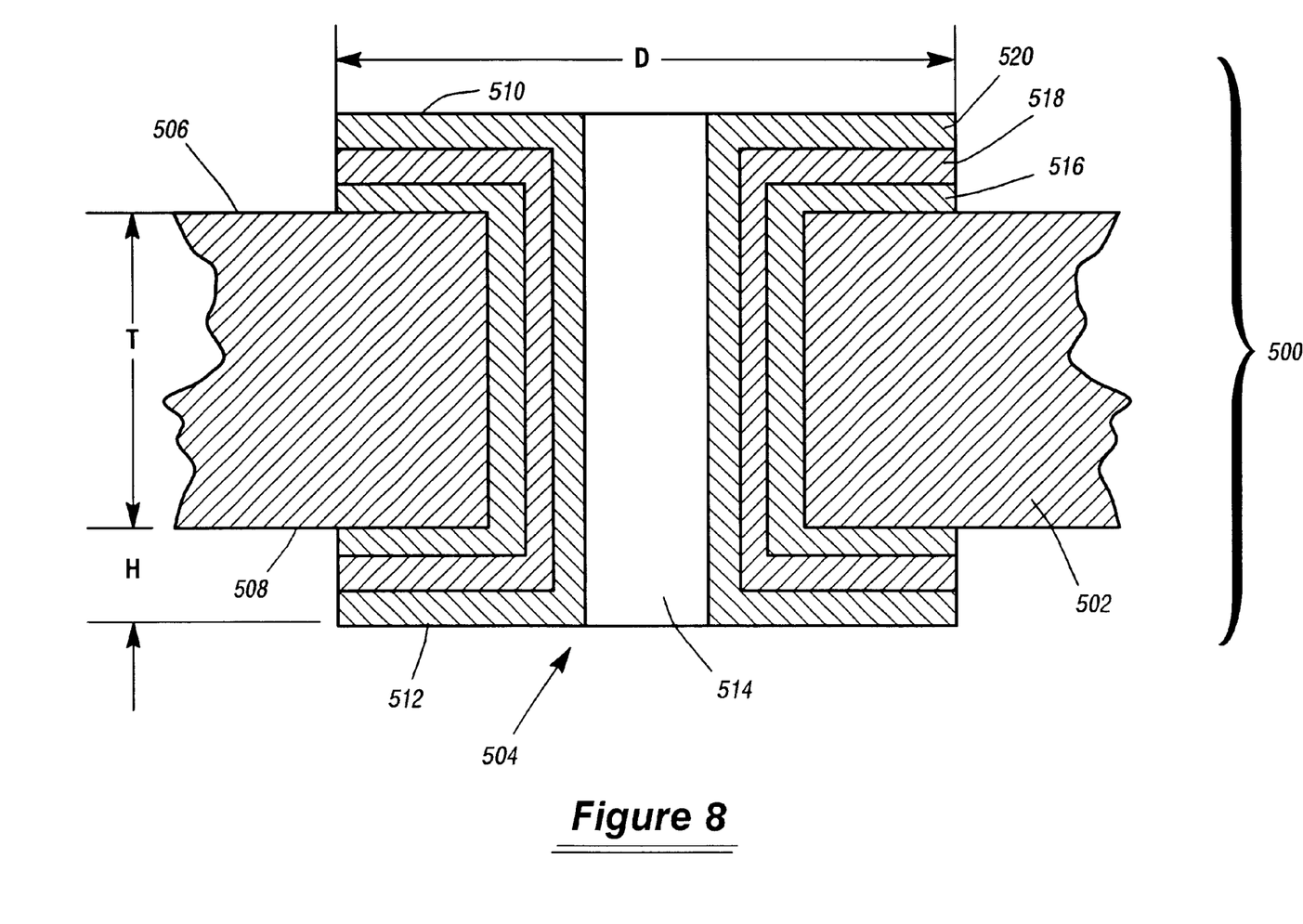
FIG. 8 is a cross-sectional side view of a portion of another embodiment of an adapter according to aspects of this invention.
Figure 9:
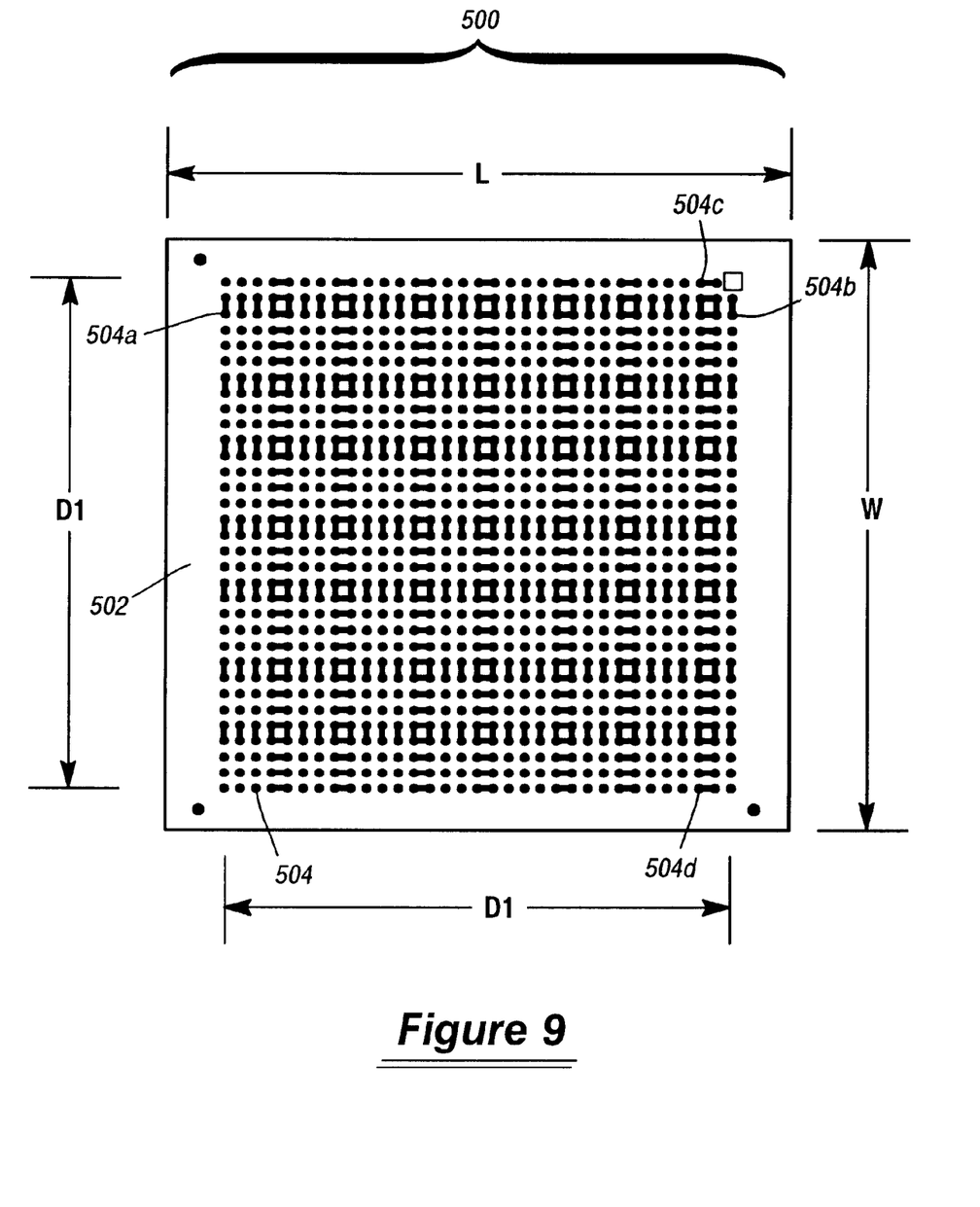
FIG. 9 is a front view of the adapter of which a portion is illustrated in FIG. 8.

Referring now to FIGS. 8 and 9, another embodiment of an adapter according to this invention will now be described. An adapter 500 is similar to adapter 400 (FIGS. 6 and 7) in that adapter 500 includes a flexible substrate 502, which is configured to be positioned adjacent an interposer socket, and a plurality of conductors 504 (only one shown in FIG. 8) extending through the flexible substrate 502. The conductor 504 includes opposed pads 510 and 512 adjacent facing surfaces 506 and 508 of the flexible substrate 502, respectively.

As with adapter 400, traces (not shown) can be added to adapter 500. See, e.g., trace 414 of adapter 400 shown in FIG. 6.

The conductor 504 of adapter 500 is formed from layers of copper, nickel, and gold. Specifically, as shown in FIG. 8, a hole is formed in flexible substrate 502. A layer of copper 516 extends through the hole and onto surfaces 506 and 508. A layer of nickel 518 extends over the layer of copper 516, and a layer of gold 520 extends over the layer of nickel 518. If one or more of the layers do not fill the hole formed in flexible substrate 502, then a hole 514 will remain.

Pads 510 and 512 of adapter 500 have a diameter "D", and adjacent conductors are preferably positioned so that their centers are at a predetermined distance from one another. For example, if a conductor has pads with a diameter D of 0.030 inch, and adjacent conductors are spaced on 0.050 inch centers, then there will be a gap of 0.020 inch between the edges of the adjacent pads. It is contemplated that a variety of dimensions and patterns could be used for the conductors, depending on the particular application in which adapter 500 is used. Nevertheless, the dimensions and pattern of the conductors preferably match those of the pads of the LGA device and circuit board with which the adapter 500 is intended to be used.

Also, pads 510 and 512 will extend above and below respective facing surfaces 506 and 508 of flexible substrate 502 by a height "H". Height H is preferably selected to enable contact between pads 510 and 512 with adjacent conductors (e.g., pads 313 of LGA device 312, pads 316 of circuit board 314, or compliant contacts 332 of interposer socket 328). Again, a variety of dimensions are contemplated, depending on engineering preferences.

Flexible substrate 502 is preferable selected to provide a flex circuit. For example, polyamide film can be used to form flexible substrate 502. Such film is available under the trademark KAPTON from E. I. du Pont de Nemours and Company of Wilmington, Del. Polyester film or other polymeric films or sheets can be substituted. Flexible substrate 502 has a thickness "T" selected so that adapter 500 is configured to flex in reaction to forces exerted by the compliant contacts of the interposer socket.

Although a thickness T of about 0.003 inch may be preferred, a thickness T of about 0.005 inch, about 0.010 inch or greater may be acceptable as well, depending upon the application, components, and planarity of the surfaces with which the adapter will be used. Substrates that are thinner than about 0.003 inch can also be used to provide additional flexibility.

For example, the compliant contacts of an interposer socket each may exert a force of approximately 2 ounces. When used with such an interposer socket, the adapter should be sufficiently flexible to flex in reaction to the contact forces, thereby facilitating contact between the adapter's conductor pads and the interposer socket contacts as well as between the adapter's conductor pads and the LGA device pads or the circuit board pads.

As shown in FIG. 9, adapter 500 is preferably shaped for use with selected LGA devices and interposer sockets. For example, adapter 500 has a length "L" and a width "W" to provide a rectangular or square perimeter. The pattern of conductors 504 provides a series of columns (33 columns shown for example in FIG. 9) and a series of rows (33 rows shown for example in FIG. 9). The conductors 504 are arranged on the flexible substrate 502 to have a distance "D1" between the centers of end conductors 504a and 504b in a row of conductors 504. Similarly, the conductors 504 are arranged to have a distance "D1" between the centers of end conductors 504c and 504d in a column of conductors 504.

Although this invention has been described with reference to specific embodiments selected for illustration in the drawings, it will be appreciated that a variety of variations and modifications to the illustrated embodiments can be made without departing from the spirit or scope of this invention.

Figure 5B:
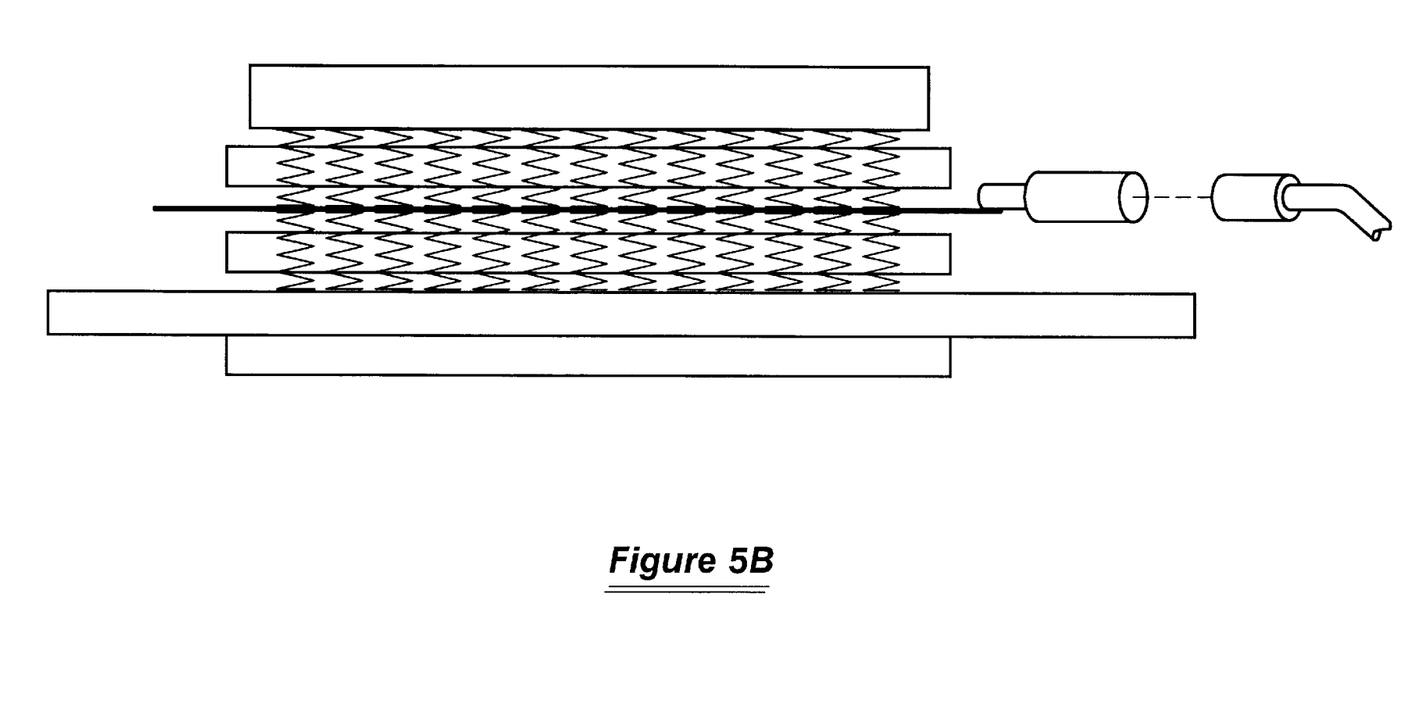
FIG. 5B is a side view of another exemplary embodiment of a circuit board assembly (300A) including an adapter according to aspects of this invention, wherein the adapter is positioned between two interposer sockets.

Although only a single interposer socket is shown in FIG. 5A, a second interposer socket is optionally introduced between the circuit board and the LGA device, as is illustrated in FIG. 5B.

For example, it has been contemplated that a second interposer socket can be interposed between the adapter 400 and the printed circuit board in order to provide compliant contacts for electrical coupling between the conductors 404 of the adapter 400 and the pads 316 of the circuit board 314. Such an assembly using multiple interposer sockets would make it possible to use an adapter formed from a rigid substrate if the interposer sockets are selected to compensate for variations in the planarity of the surfaces of the LGA device, adapters, and circuit board. Nevertheless, the use of an adapter having a flexible substrate is preferred in order to eliminate the expense of providing a second interposer socket and to avoid the change in height required by the use of an additional interposer socket as well as additional fastener hardware for the second interposer socket.

Similarly, more that one adapter can be used—one adjacent the LGA device and one adjacent the circuit board—in order to provide multiple circuit modification or additional space for peripheral contacts at the edge of the adapters. Also, although the adapter may be formed from a flex circuit produced using a variety of materials, the flex circuit is preferably formed from a polymeric film as opposed to rigid glass-fiber reinforced board.

Additional modifications can be made without departing from the scope of this invention, which is defined separately in the appended claims.

What is claimed:

1. A circuit board assembly comprising a circuit board having a plurality of pads;

a land grid array (LGA) device having a plurality of pads;

an interposer socket positioned to extend in a space between said circuit board and said LGA device and having a plurality of compliant contacts positioned for contact with said pads of said LGA device or said pads of said circuit board;

an adapter positioned to extend in a space between said interposer socket and said circuit board, said adapter comprising a flexible substrate positioned adjacent said interposer socket and a plurality of conductors extending through said flexible substrate, said conductors comprising pads adjacent facing surfaces of said flexible substrate, wherein pads adjacent one facing surface of the flexible substrate are positioned for electrical contact with said compliant contacts of said interposer socket;

said flexible substrate of said adapter being configured to flex in reaction to forces exerted by said compliant contacts of said interposer socket, thereby maintaining electrical contact between said pads of said circuit board and said pads of said adapter;

a periphery pad for connection to an external circuit for modification of circuitry of the printed circuit board.

2. A circuit board assembly as recited in claim 1, said adapter further comprising at least one conductor positioned at a periphery of said flexible substrate and connected to one of said conductors extending through said flexible substrate.

3. A circuit board assembly as recited in claim 1, said flexible substrate of said adapter being formed from a polymeric film.

4. A circuit board assembly as recited in claim 1, wherein said flexible substrate of said adapter has a flexibility sufficient to conform said pads of said conductors to pads of the LGA device or the circuit board.

5. A circuit board assembly as recited in claim 1, said conductors of said adapter comprising plated vias.

6. A circuit board assembly as recited in claim 1, said conductors of said adapter being arranged in a pattern corresponding to said pads of said LGA device.

7. A circuit board assembly as recited in claim 1, wherein said pads of said conductors of said adapter extend beyond said facing surfaces of said flexible substrate of said adapter.

8. A circuit board assembly as recited in claim 1, further comprising a back-up plate positioned adjacent said circuit board such that said circuit board extends between said back-up plate and said LGA device.

9. A circuit board assembly as recited in claim 8, further comprising a fastener connected to said back-up plate to urge said LGA device and said circuit board toward one another.

10. A circuit board assembly as recited in claim 1, further comprising a second interposer socket positioned to extend in a space between said adapter and said circuit board or said LGA device.

\* \* \* \* \*